United States Patent
Her

(10) Patent No.: US 10,177,209 B2
(45) Date of Patent: Jan. 8, 2019

(54) ORGANIC LIGHT-EMITTING DIODE (OLED) DISPLAY

(71) Applicant: Samsung Display Co., Ltd., Yongin-si, Gyeonggi-do (KR)

(72) Inventor: Yong-Koo Her, Yongin-si (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 15/920,180

(22) Filed: Mar. 13, 2018

(65) Prior Publication Data

US 2018/0204899 A1 Jul. 19, 2018

Related U.S. Application Data

(62) Division of application No. 14/465,683, filed on Aug. 21, 2014, now Pat. No. 9,941,339.

(30) Foreign Application Priority Data

Mar. 7, 2014 (KR) ........................ 10-2014-0027429

(51) Int. Cl.
*H01L 27/32* (2006.01)
*G09G 3/32* (2016.01)
*G09G 3/3233* (2016.01)

(52) U.S. Cl.
CPC ....... *H01L 27/3262* (2013.01); *G09G 3/3233* (2013.01); *G09G 2300/0852* (2013.01); *G09G 2300/0861* (2013.01); *G09G 2310/0251* (2013.01); *H01L 27/3265* (2013.01)

(58) Field of Classification Search
CPC ............ H01L 27/3262; H01L 27/3265; G09G 3/3233; G09G 2300/0861; G09G 2310/0251; G09G 2300/0852
See application file for complete search history.

(56) References Cited

U.S. PATENT DOCUMENTS

| | | | |
|---|---|---|---|
| 7,435,992 B2 | 10/2008 | Choi et al. | |
| 2003/0141811 A1* | 7/2003 | Park | H01L 27/3265 313/506 |
| 2009/0009094 A1 | 1/2009 | Choi et al. | |

(Continued)

FOREIGN PATENT DOCUMENTS

| KR | 10-2003-0069668 A | 8/2003 |
|---|---|---|
| KR | 10-2013-0092229 A | 8/2013 |

(Continued)

*Primary Examiner* — Stephen G Sherman

(57) ABSTRACT

An organic light-emitting diode (OLED) display is disclosed. In one aspect, the OLED display includes a plurality of pixels, each including a driving thin film transistor (TFT) formed over a substrate and including a driving gate electrode, a first storage capacitor comprising a first electrode and a second electrode, and a second storage capacitor comprising a third electrode and a fourth electrode. The first electrode is electrically connected to the driving gate electrode and the second electrode is formed over the first electrode and electrically insulated from the first electrode. The third electrode is electrically connected to the first electrode, is formed on a different layer from each of the first and second electrodes, and does not overlap the second electrode. The fourth electrode is formed over the third electrode and electrically insulated from the third electrode.

10 Claims, 9 Drawing Sheets

(56) References Cited

U.S. PATENT DOCUMENTS

| | | | |
|---|---|---|---|
| 2011/0128211 A1* | 6/2011 | Ono | H01L 27/3265 345/76 |
| 2013/0207117 A1* | 8/2013 | An | H01L 27/3276 257/71 |
| 2013/0241916 A1 | 9/2013 | Takasugi et al. | |
| 2014/0034923 A1 | 2/2014 | Kim et al. | |
| 2014/0077176 A1 | 3/2014 | Lee et al. | |
| 2015/0097172 A1 | 4/2015 | Han et al. | |

FOREIGN PATENT DOCUMENTS

| | | |
|---|---|---|
| KR | 10-2014-0018623 A | 2/2014 |
| KR | 10-2014-0037715 A | 3/2014 |

\* cited by examiner

ORGANIC LIGHT-EMITTING DIODE (OLED) DISPLAY

INCORPORATION BY REFERENCE TO ANY PRIORITY APPLICATIONS

This application is a divisional of U.S. patent application Ser. No. 14/465,683, filed Aug. 21, 2014, which claims priority under 35 U.S.C. 119 of Korean Patent Application No. 10-2014-0027429, filed on Mar. 7, 2014, in the Korean Intellectual Property Office, the disclosures of which are incorporated by reference herein in their entireties.

BACKGROUND

Field

The described technology generally relates to an organic light-emitting diode (OLED) display.

Description of the Related Technology

Organic light-emitting diode (OLED) displays include two electrodes and an organic emission layer interposed therebetween. Electrons injected from one of the electrodes and holes injected from the other electrode are combined in the organic emission layer to generate excitons. When the excitons fall from an excited state to a ground state they emit light.

OLED displays include a plurality of pixels each including an OLED which is a self-emissive component. Each of the pixels also includes a plurality of thin film transistors (TFTs) and at least one capacitor.

SUMMARY OF CERTAIN INVENTIVE ASPECTS

One inventive aspect is an organic light-emitting diode (OLED) display including at least one capacitor in a pixel.

Another aspect is an OLED display including a capacitor structure for maintaining and supplementing capacitance in pixels having a high-resolution.

Another aspect is an OLED display including a plurality of pixels. Each of the pixels includes a driving thin film transistor (TFT) provided on a substrate; a first storage capacitor including a first electrode and a second electrode, in which the first electrode is connected to a driving gate electrode of the driving TFT and the second electrode is provided on the first electrode and insulated from the first electrode; and a second storage capacitor including a third electrode and a fourth electrode, in which the third electrode is electrically connected to the first electrode, provided on a different layer from the first and second electrodes, and does not overlap the second electrode of the first storage capacitor, and the fourth electrode is provided on the third electrode and insulated from the third electrode.

The driving gate electrode and the first electrode may be integrally formed on the same layer.

The driving TFT may further include a driving semiconductor layer that is provided below the driving gate electrode and is insulated from the driving gate electrode by a first gate insulating layer and a second gate insulating layer that are sequentially stacked on the substrate.

The OLED display may further include an emission control TFT that is provided between the driving TFT and an OLED, and includes an emission control semiconductor layer that is on the same layer as the driving semiconductor layer of the driving TFT; and an emission control gate electrode that is insulated from the emission control semiconductor layer by the first gate insulating layer that covers the emission control semiconductor layer.

The OLED display may further include a third gate insulating layer provided between the first and second electrodes.

The OLED display may further include a first interlayer insulating layer provided between the second and third electrodes, and in which the first and third electrodes are electrically connected to each other via a contact hole that is commonly formed in the third gate insulating layer and the first interlayer insulating layer.

The OLED display may further include a second interlayer insulating layer provided between the third and fourth electrodes.

The second electrode may be connected to a driving voltage line that transmits a driving voltage for driving the OLED.

The fourth electrode may be connected to an initialization voltage line that transmits an initialization voltage for initializing the driving TFT.

The OLED display may further include a protection layer provided on the fourth electrode. The OLED may include an anode electrode that is provided on the protection layer, a cathode electrode facing the anode electrode, and an intermediate layer formed between the anode and cathode electrodes.

Another aspect is an OLED display including a plurality of pixels. Each of the pixels includes: a driving thin film transistor (TFT) provided on a substrate; a first storage capacitor including a first electrode and a second electrode, in which the first electrode is connected to a driving gate electrode of the driving TFT and the second electrode is provided on the first electrode and insulated from the first electrode; and a second storage capacitor, which does not overlap the first storage capacitor, including a third electrode and a fourth electrode, in which the third electrode is electrically connected to the first electrode, and the fourth electrode is provided below the third electrode, insulated from the third electrode, and is provided on the same layer as the first electrode.

The driving gate electrode and the first electrode may be integrally formed on the same layer.

The driving TFT may further include a driving semiconductor layer that is provided below the driving gate electrode and is insulated from the driving gate electrode by a first gate insulating layer.

The OLED display may further include an emission control TFT that is provided between the driving TFT and an OLED, and includes an emission control semiconductor layer that is on the same layer as the driving semiconductor layer of the driving TFT; and an emission control gate electrode that is insulated from the emission control semiconductor layer by the first gate insulating layer that covers the emission control semiconductor layer, and is provided on the same layer as the driving gate electrode.

The OLED display may further include a second gate insulating layer provided between the first and second electrodes.

The OLED display may further include a first interlayer insulating layer, which is provided between the third and fourth electrodes.

The second electrode may be connected to a driving voltage line that transmits a driving voltage for driving the OLED.

The OLED display may further include an initialization TFT that is provided between the driving TFT and an initialization voltage line that transmits an initialization voltage, turned on by a scan signal, and thus transmits the initialization voltage to a driving gate electrode.

The fourth electrode may be connected to the scan line that transmits the scan signal.

The OLED display may further include a protection layer provided on the fourth electrode. The OLED may include an anode electrode that is provided on the protection layer, a cathode electrode facing the anode electrode, and an intermediate layer formed between the anode and cathode electrodes.

Another aspect is an OLED display, comprising a plurality of pixels, wherein each of the pixels comprises: a driving thin film transistor (TFT) formed over a substrate and including a driving gate electrode; a first storage capacitor comprising a first electrode and a second electrode, wherein the first electrode is electrically connected to the driving gate electrode and wherein the second electrode is formed over the first electrode and electrically insulated from the first electrode; and a second storage capacitor comprising a third electrode and a fourth electrode, wherein the third electrode is electrically connected to the first electrode, is formed on a different layer from each of the first and second electrodes, and does not overlap the second electrode and wherein the fourth electrode is formed over the third electrode and electrically insulated from the third electrode.

Each of the driving gate electrodes can be integrally formed with the corresponding first electrode. Each of the driving TFTs can further comprise a driving semiconductor layer formed under the driving gate electrode, wherein each of the driving semiconductor layers is electrically insulated from the corresponding driving gate electrode via a first gate insulating layer and a second gate insulating layer that are sequentially stacked over the substrate. Each of the pixels can further comprise an OLED and an emission control TFT that is formed between the driving TFT and the OLED, wherein each of the emission control TFTs comprises an emission control semiconductor layer formed on the same layer as the driving semiconductor layer and an emission control gate electrode electrically insulated from the emission control semiconductor layer via the first gate insulating layer. The OLED display can further comprise a third gate insulating layer formed between each of the first and second electrodes. The OLED display can further comprise a first interlayer insulating layer formed between each of the second and third electrodes, wherein each of the first electrodes is electrically connected to the corresponding third electrode via a corresponding contact hole formed in each of the third gate insulating layer and the first interlayer insulating layer.

The OLED display can further comprise a second interlayer insulating layer formed between each of the third and fourth electrodes. Each of the second electrodes can be electrically connected to a corresponding driving voltage line configured to transmit a driving voltage for driving the corresponding OLED. Each of the fourth electrodes can be electrically connected to a corresponding initialization voltage line configured to transmit an initialization voltage for initializing the corresponding driving TFT. The OLED display can further comprise a protection layer formed over the fourth electrode, wherein each of the OLEDs comprises an anode electrode formed over the protection layer; a cathode electrode facing the anode electrode; and an intermediate layer interposed between the anode and cathode electrodes.

Another aspect is an OLED display, comprising a plurality of pixels, wherein each of the pixels comprises: a driving thin film transistor (TFT) formed over a substrate and including a driving gate electrode; a first storage capacitor comprising a first electrode and a second electrode, wherein the first electrode is electrically connected to the driving gate electrode and wherein the second electrode is formed over the first electrode and electrically insulated from the first electrode; and a second storage capacitor comprising a third electrode and a fourth electrode, wherein the second storage capacitor does not overlap the first storage capacitor, wherein the third electrode is electrically connected to the first electrode, and wherein the fourth electrode is: formed under the third electrode, electrically insulated from the third electrode, and formed on the same layer as the first electrode.

Each of the driving gate electrodes can be integrally formed with the corresponding first electrode. Each of the driving TFTs can further comprise a driving semiconductor layer formed under the driving gate electrode, wherein each of the driving semiconductor layers is electrically insulated from the corresponding driving gate electrode via a first gate insulating layer. Each of the pixels can further comprise an OLED and an emission control TFT formed between the driving TFT and the OLED, wherein each of the emission control TFTs comprises an emission control semiconductor layer formed on the same layer as the driving semiconductor layer and an emission control gate electrode electrically insulated from the emission control semiconductor layer via the first gate insulating layer, wherein the emission control gate electrode is formed on the same layer as the driving gate electrode. The OLED display can further comprise a second gate insulating layer formed between the first and second electrodes. The OLED display can further comprise an interlayer insulating layer formed between the third and fourth electrodes.

Each of the second electrodes can be electrically connected to a corresponding driving voltage line configured to transmit a driving voltage for driving the corresponding OLED. Each pixel can further comprise an initialization TFT formed between the driving TFT and an initialization voltage line configured to transmit an initialization voltage, wherein each of the initialization TFTs is configured to be turned on by a corresponding scan signal so as to transmit the initialization voltage to the corresponding driving gate electrode. The fourth electrode can be electrically connected to a scan line configured to transmit the scan signal. The OLED display can further comprise a protection layer formed over the fourth electrode, wherein each of the OLEDs comprises an anode electrode formed over the protection layer; a cathode electrode facing the anode electrode; and an intermediate layer interposed between the anode and cathode electrodes.

DETAILED DESCRIPTION OF CERTAIN INVENTIVE EMBODIMENTS

Figure 1:
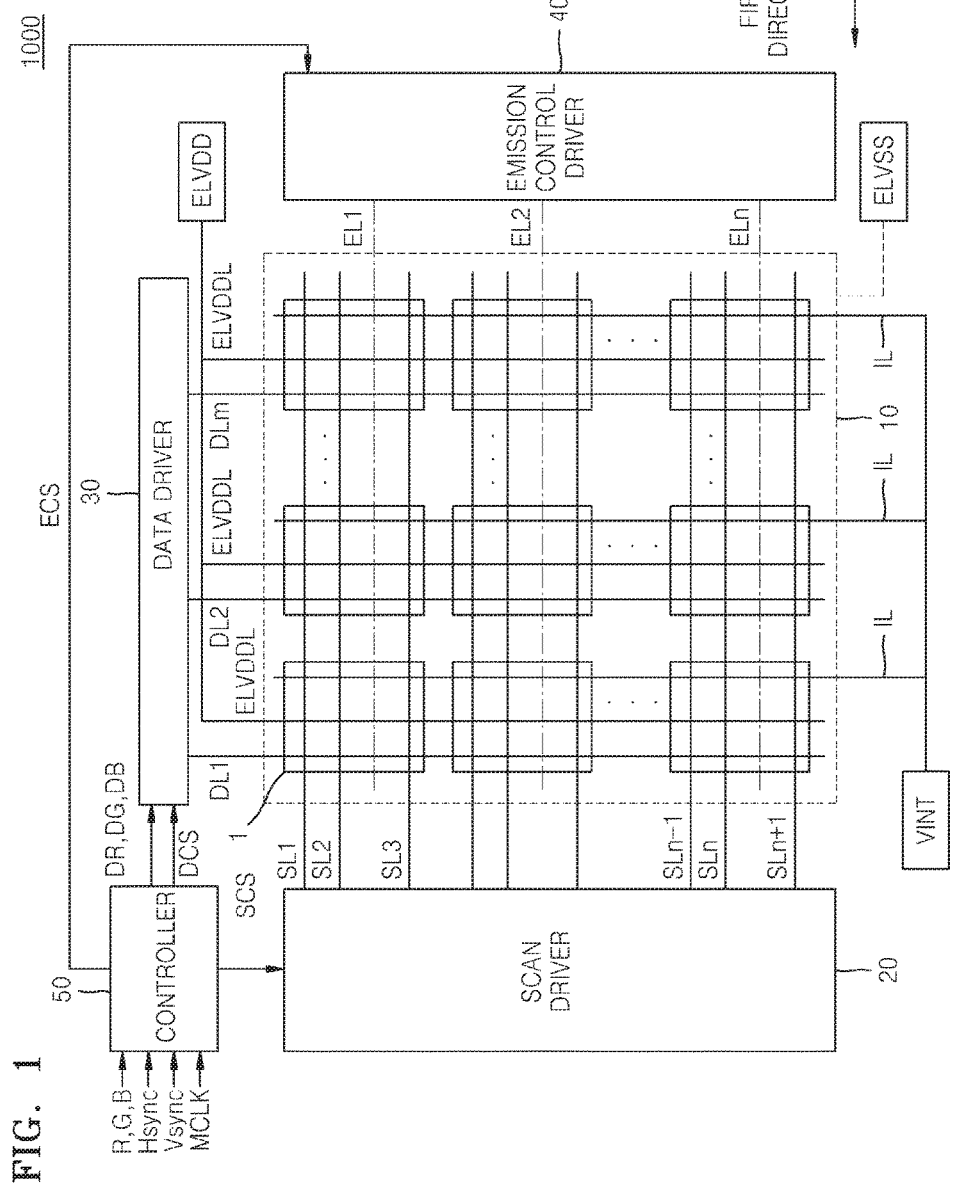
FIG. 1 is a schematic block diagram of an OLED display according to an embodiment.

Capacitors used in the pixels of an OLED display typically include a lower electrode, an upper electrode, and a dielectric material provided between the lower and upper electrodes. The capacitance of such a capacitor is proportionate to the overlapping area of the lower and upper electrodes. Accordingly, as the overlapping area of the lower and upper electrode decreases, the capacitance of the capacitor also decreases. As the resolution of OLED displays increases, more pixels are required to be included per unit area, reducing the available area for each pixel. In order to normally operate, OLED displays are required to include a predetermined number of capacitors. Accordingly, capacitors need a new design that is appropriate for high-resolution OLED displays.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when a layer, region, or component is referred to as being "formed on," another layer, region, or component, it can be directly or indirectly formed on the other layer, region, or component. That is, for example, intervening layers, regions, or components may be present.

The sizes of elements in the drawings may be exaggerated for convenience of explanation. In other words, since the sizes and thicknesses of components in the drawings may be exaggerated, the following embodiments are not limited thereto.

FIG. 1 is a schematic block diagram of an OLED display 1000 according to an embodiment.

The OLED display 1000 includes a display unit 10 including a plurality of pixels 1, a scan driver 20, a data driver 30, an emission control driver 40, and a controller 50.

The display unit 10 is located at the intersection between a plurality of scan lines SL1 to SLn+1, a plurality of data lines DL1 to DLm, and a plurality of emission control lines EL1 to ELn. The display unit 10 includes the pixels 1 that are arranged in a matrix. The scan lines SL1 to SLn+1 and the emission control lines EL1 to ELn extend in a second direction, i.e., a row direction and the data lines DL1 to DLm and driving voltage lines ELVDDL extend in a first direction, i.e., a column direction. In each pixel line, the n-value of the scan lines SL1 to SLn+1 may differ from the n-value of the emission control lines EL1 to ELn.

Each pixel 1 is connected to three scan lines from among the scan lines SL1 to SLn+1 that extend across the display unit 10. The scan driver 20 transmits three scan signals to each pixel 1 via the plurality of scan lines SL1 to SLn+1. That is, the scan driver 20 sequentially supplies scan signals via first scan lines SL2 to SLn, second scan lines SL1 to SLn−1, or third scan lines SL3 to SLn+1.

Initialization voltage lines IL receive an initialization voltage for initializing the display unit 10 from an external power supply source VINT.

Each pixel 1 is also connected to one of the data lines DL1 to DLm that extend across the display unit 10 and one of the emission control lines EL1 to ELn that extend across the display unit 10.

The data driver 30 transmits data signals to the pixels 1 via the data lines DL1 to DLm. The data signals are supplied to a pixel selected by a scan signal whenever the scan signals are supplied via the first scan lines SL2 to SLn+1.

The emission control driver 40 generates and transmits emission control signals to the pixels 1 via the emission control lines EL1 to ELn. The emission control signals control the emission timing of the pixels 1. The emission control driver 40 may be omitted depending on the internal structure of the pixels 1.

The controller 50 converts a plurality of image signals R, G, and B that are received from an external source into a plurality of image data signals DR, DG, and DB and transmits the image data signals DR, DG, and DB to the data driver 30. Also, the controller 50 receives vertical synchronization signals Vsync, horizontal synchronization signals Hsync, and clock signals MCLK, and generates and transmits control signals for controlling the operation of the scan driver 20, the data driver 30, and the emission control driver 40. That is, the controller 50 generates scan driver control signals SCS for controlling the scan driver 20, data driver control signals DCS for controlling the data driver 30, and emission driver control signals ECS for controlling the emission control driver 40, and transmits each signal to its corresponding driver.

Each of the pixels 1 receives a first power voltage ELVDD and a second power voltage ELVSS. The first power voltage ELVDD may be a predetermined high level voltage and the second power voltage ELVSS may be a voltage that is lower than the first power voltage ELVDD or a ground voltage. The first power voltage ELVDD is provided to the pixels 1 via the driving voltage lines ELVDDL.

Each of the pixels 1 emits light having a predetermined brightness based on a driving current that is supplied to OLEDs according to the data signals received via the data lines DL1 to DLm.

Figure 2:
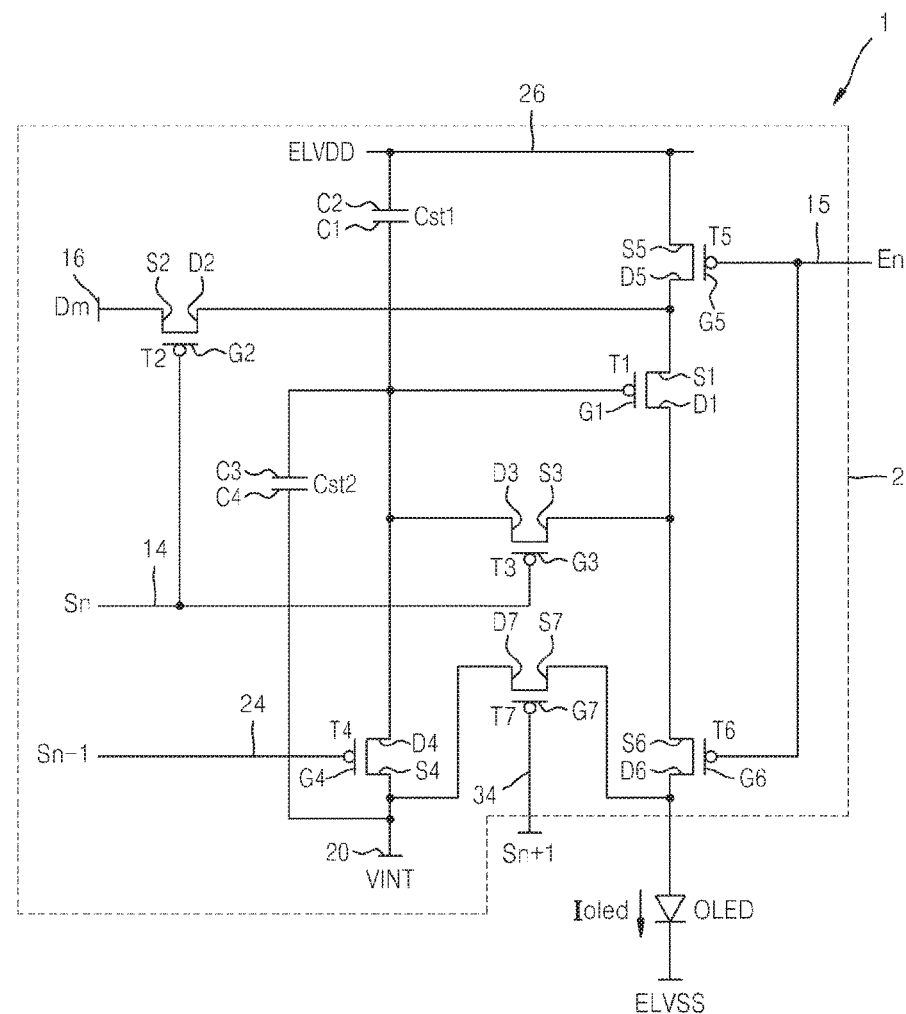
FIG. 2 is an equivalent circuit diagram of a pixel of the OLED display according to an embodiment.

FIG. 2 is an equivalent circuit diagram of the pixel 1 of the OLED display 1000 according to an embodiment.

The pixel 1 of the OLED display 1000 includes a pixel circuit 2 that includes a plurality of thin film transistors (TFTs) T1 to T7 and two storage capacitors, namely, first and second storage capacitors Cst1 and Cst2. The pixel 1 also includes an OLED that receives a driving current via the pixel circuit 2 and thus emits light.

The TFTs T1 to T7 include a driving TFT T1, a switching TFT T2, a compensation TFT T3, a first initialization TFT T4, a first emission control TFT T5, a second emission control TFT T6, and a second initialization TFT T7.

The pixel 1 includes a first scan line 14 that transmits a first scan signal Sn to the switching TFT T2 and the compensation TFT T3, a second scan line 24 that transmits a second scan signal Sn−1 to the first initialization TFT T4, and a third scan line 34 that transmits a third scan signal Sn+1 to the second initialization TFT T7. The pixel 1 also includes an emission control line 15 that transmits an emission control signal En to the first emission control TFT T5 and the second emission control TFT T6, a data line 16 that intersects the first scan line 14 and transmits a data signal Dm, a driving voltage line 26 that transmits the first power voltage ELVDD, and an initialization voltage line 20 that transmits an initialization voltage VINT to initialize the driving TFT T1.

A gate electrode G1 of the driving TFT T1 is connected to a first electrode C1 of the first storage capacitor Cst1 and a third electrode C3 of the second storage capacitor Cst2. A source electrode S1 of the driving TFT T1 is connected to the driving voltage line 26 via the first emission control TFT T5. A drain electrode D1 of the driving TFT T1 is electrically connected to an anode electrode of the OLED via the second emission control TFT T6. The driving TFT T1 receives the data signal Dm based on a switching operation of the switching TFT T2 and supplies a driving current Ioled to the OLED.

A gate electrode G2 of the switching TFT T2 is connected to the first scan line 14. A source electrode S2 of the switching TFT T2 is connected to the data line 16. A drain electrode D2 of the switching TFT T2 is connected to the source electrode S1 of the driving TFT T1 and to the driving voltage line 26 via the first emission control TFT T5. The switching TFT T2 is turned on based on the first scan signal Sn received via the first scan line 14 and performs a switching operation in which the data signal Dm received via the data line 16 is transmitted to the source electrode S1 of the driving TFT T1.

A gate electrode G3 of the compensation TFT T3 is connected to the first scan line 14. A source electrode S3 of the compensation TFT T3 is connected to the drain electrode D1 of the driving TFT T1 and to the anode electrode of the OLED via the second emission control TFT T6. A drain electrode D3 of the compensation TFT T3 is connected to the first electrode C1 of the first storage capacitor Cst1, the third electrode C3 of the second storage capacitor Cst2, a drain electrode D4 of the first initialization TFT T4, and the gate electrode G1 of the driving TFT T1. The compensation TFT T3 is turned on based on the first scan signal Sn received via the first scan line 14 and connects the driving TFT T1 to form a diode connection by connecting the gate electrode G1 and the drain electrode D1 of the driving TFT T1.

A gate electrode G4 of the first initialization TFT T4 is connected to the second scan line 24. A source electrode S4 of the first initialization TFT T4 is connected to the initialization voltage line 20. The drain electrode D4 of the first initialization TFT T4 is connected to the first electrode C1 of the first storage capacitor Cst1, the third electrode C3 of the second storage capacitor Cst2, the drain electrode D3 of the compensation TFT T3, and the gate electrode G1 of the driving TFT T1. The first initialization TFT T4 is turned on based on the second scan signal Sn−1 received via the second scan line 24 and performs an initialization operation in which the initialization voltage VINT is transmitted to the gate electrode G1 of the driving TFT T1 and thus initializes the voltage of the gate electrode G1 of the driving TFT T1.

A gate electrode G5 of the first emission control TFT T5 is connected to the emission control line 15. A source electrode S5 of the first emission control TFT T5 is connected to the driving voltage line 26. A drain electrode D5 of the first emission control TFT T5 is connected to the source electrode S1 of the driving TFT T1 and the drain electrode D2 of the switching TFT T2.

A gate electrode G6 of the second emission control TFT T6 is connected to the emission control line 15. A source electrode S6 of the second emission control TFT T6 is connected to the drain electrode D1 of the driving TFT T1 and the source electrode S3 of the compensation TFT T3. A drain electrode D6 of the second emission control TFT T6 is electrically connected to the anode electrode of the OLED. The first and second emission control TFTs T5 and T6 are substantially simultaneously turned on based on the emission control signal En received via the emission control line 15. Then, the first power voltage ELVDD is transmitted to the OLED, and thus, the driving current Ioled flows in the OLED.

A gate electrode G7 of the second initialization TFT T7 is connected to the third scan line 34. A source electrode S7 of the second initialization TFT T7 is connected to the anode electrode of the OLED. A drain electrode D7 of the second initialization TFT T7 is connected to the initialization voltage line 20. The second initialization TFT T7 is turned on based on the third scan signal Sn+1 received via the third scan line 34 and initializes the anode electrode of the OLED.

A second electrode C2 of the first storage capacitor Cst1 is connected to the driving voltage line 26. The first electrode C1 of the first storage capacitor Cst1 is connected to the gate electrode G1 of the driving TFT T1, the third electrode C3 of the second storage capacitor Cst2, the drain electrode D3 of the compensation TFT T3, and the drain electrode D4 of the first initialization TFT T4.

The third electrode C3 of the second storage capacitor Cst2 is connected to the gate electrode G1 of the driving TFT T1, the first electrode C1 of the first storage capacitor Cst1, the drain electrode D3 of the compensation TFT T3, and the drain electrode D4 of the first initialization TFT T4. A fourth electrode C4 of the second storage capacitor Cst2 is connected to the initialization voltage line 20.

The second power voltage ELVSS is applied to a cathode electrode of the OLED. The OLED displays an image by receiving the driving current Ioled from the driving TFT T1 and thus emits light.

Figure 3A:
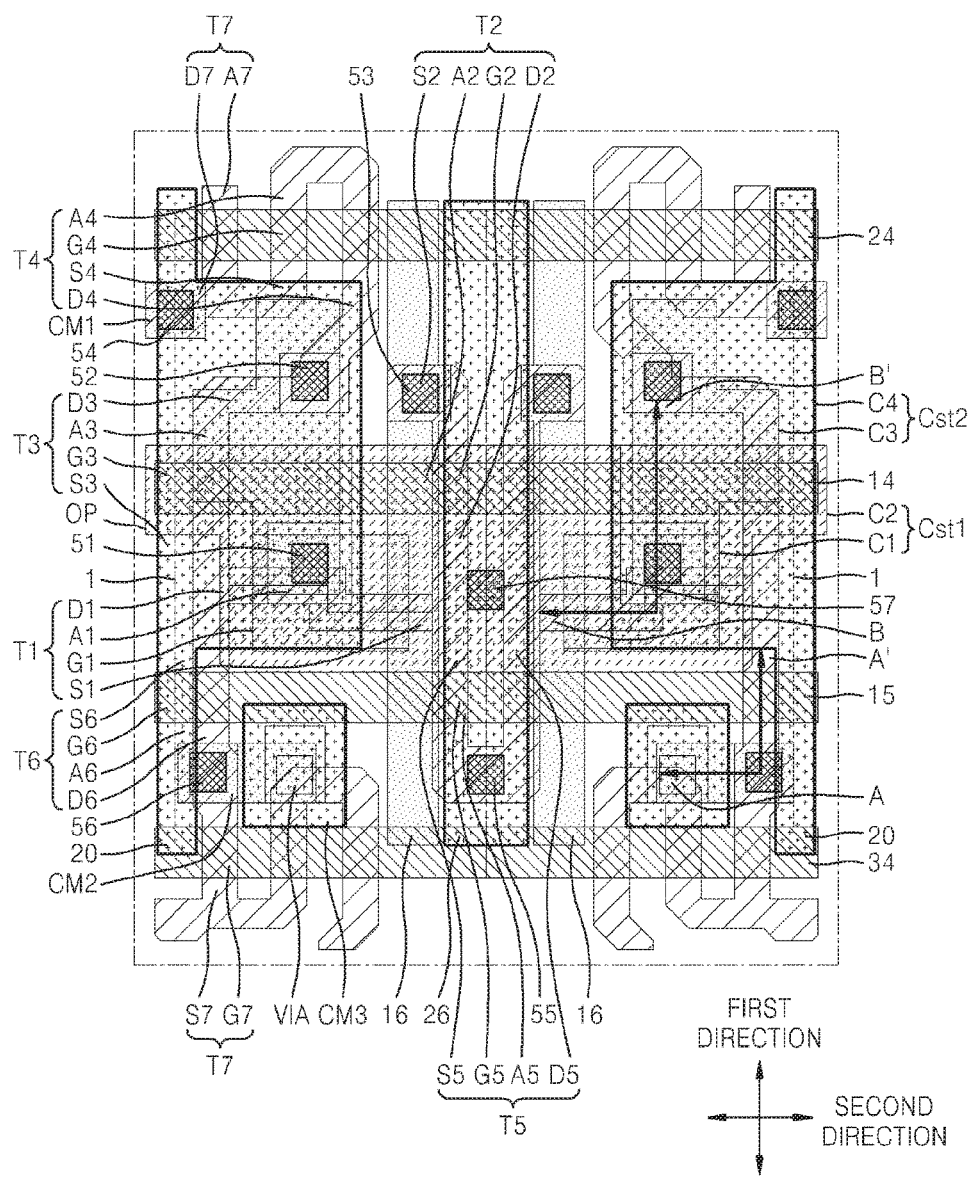
FIGS. 3A and 3B are schematic plan views of the pixel of FIG. 2.
Figure 3B:
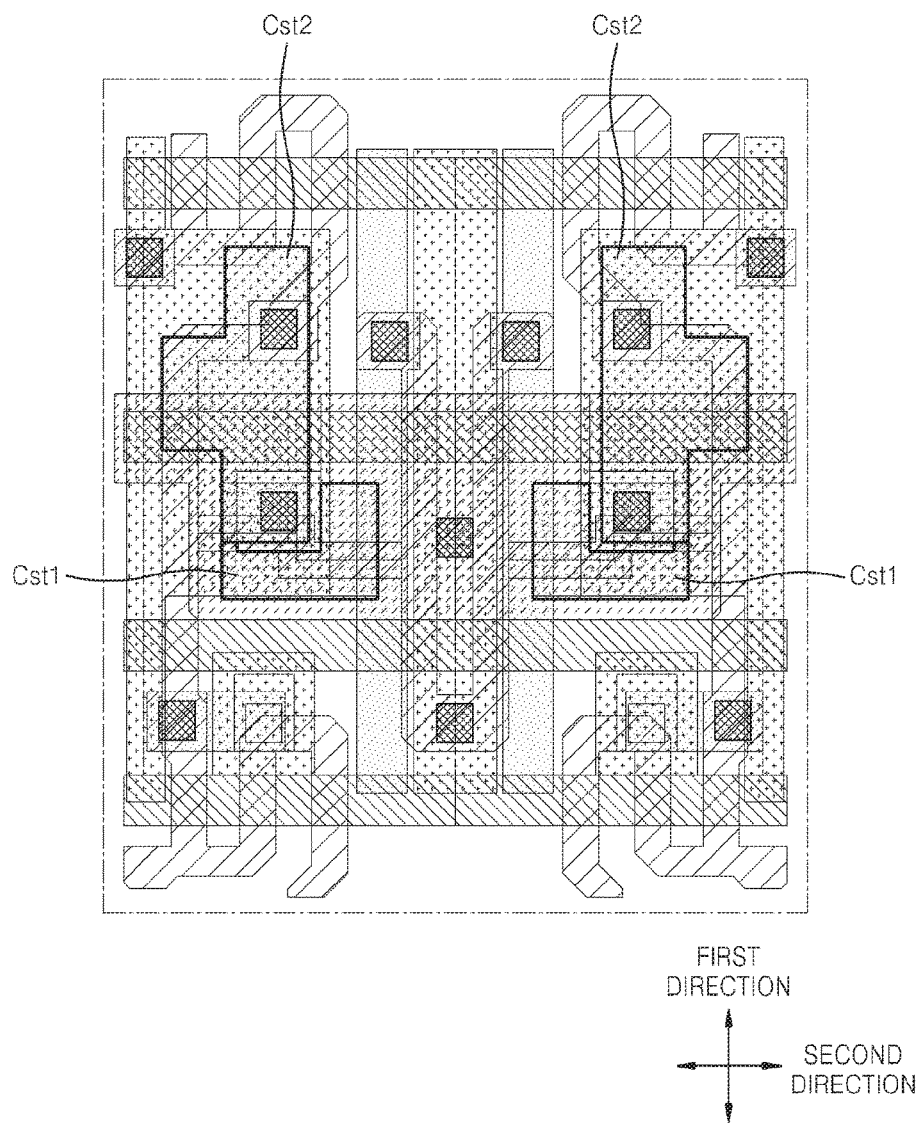

FIGS. 3A and 3B are schematic plan views of the pixel 1 of FIG. 2, according to an embodiment. FIGS. 3A and 3B each illustrate two pixels 1 that are adjacent to each other (hereinafter, referred to as "two adjacent pixels 1").

Referring FIG. 3A, the pixel 1 includes the driving TFT T1, the switching TFT T2, the compensation TFT T3, the first initialization TFT T4, the first emission control TFT T5, the second emission control TFT T6, the second initialization TFT T7, the first storage capacitor Cst1, and the second storage capacitor Cst2. The OLED is omitted from the illustration of FIG. 3A.

The driving TFT T1 includes a driving semiconductor layer A1, a driving gate electrode G1, a driving source electrode S1, and a driving drain electrode D1. The driving source electrode S1 is a driving source area in the driving semiconductor layer A1 which is doped with impurities and the driving drain electrode D1 is a driving drain area in the driving semiconductor layer A1 which is doped with impurities. The driving gate electrode G1 is connected to the first electrode C1 of the first storage capacitor Cst1, the third electrode C3 of the second storage capacitor Cst2, a compensation drain electrode D3 of the compensation TFT T3, and a first initialization drain electrode D4 of the first initialization TFT T4. In the FIG. 3A embodiment, the driving gate electrode G1 and the first electrode C1 are integrally formed. Also, the driving gate electrode G1 and the third electrode C3 are connected via a first contact hole 51. In order to connect the driving gate electrode G1 and the third electrode C3 via the first contact hole 51, the second electrode C2 does not completely overlap the first electrode C1, but includes an opening OP that exposes the first electrode C1. The driving gate electrode G1, the compensation drain electrode D3, and the first initialization drain electrode D4 are connected via the third electrode C3 formed in the first contact hole 51 and a second contact hole 52.

The switching TFT T2 includes a switching semiconductor layer A2, a switching gate electrode G2, a switching source electrode S2, and a switching drain electrode D2. The switching source electrode S2 is a switching source area in the switching semiconductor layer A2 which is doped with impurities and the switching drain electrode D2 is a switching drain area in the switching semiconductor layer A2 which is doped with impurities. The switching source electrode S2 is connected to the data line 16 via a third contact hole 53. The switching gate electrode G2 is formed as a portion of the first scan line 14.

The compensation TFT T3 includes a compensation semiconductor layer A3, a compensation gate electrode G3, a compensation source electrode S3, and the compensation drain electrode D3. The compensation source electrode S3 is a compensation source area in the compensation semiconductor layer A3 which is doped with impurities and the compensation drain electrode D3 is a compensation drain area in the compensation semiconductor layer A3 which is doped with impurities. The compensation gate electrode G3 is formed as a portion of the first scan line 14.

The first initialization TFT T4 includes a first initialization semiconductor layer A4, a first initialization gate electrode G4, a first initialization source electrode S4, and the first initialization drain electrode D4. The first initialization source electrode S4 is a first initialization source area in the first initialization semiconductor layer A4 which is doped with impurities and the first initialization drain electrode D4 is a first initialization drain area in the first initialization semiconductor layer A4 which is doped with impurities. The first initialization source electrode S4 may be connected to the initialization voltage line 20 by using a first contact metal CM1 formed in a fourth contact hole 54. The first initialization drain electrode D4 may be connected to the third electrode C3 of the second storage capacitor Cst2 via the second contact hole 52. The first initialization gate electrode G4 is formed as a portion of the second scan line 24. A dual gate electrode is formed by overlapping the first initialization semiconductor layer A4 and the first initialization gate electrode G4 twice.

The first emission control TFT T5 includes a first emission control semiconductor layer A5, a first emission control gate electrode G5, a first emission control source electrode S5, and a first emission control drain electrode D5. The first emission control source electrode S5 is a first emission control source area in the first emission control semiconductor layer A5 which is doped with impurities and the first emission control drain electrode D5 is a first emission control drain area in the first emission control semiconductor layer A5 which is doped with impurities. The first emission control source electrode S5 may be connected to the driving voltage line 26 via a fifth contact hole 55. The first emission control gate electrode G5 is formed as a portion of the emission control line 15.

The second emission control TFT T6 includes a second emission control semiconductor layer A6, a second emission control gate electrode G6, a second emission control source electrode S6, and a second emission control drain electrode D6. The second emission control source electrode S6 is a second emission control source area in the second emission control semiconductor layer A6 which is doped with impurities and the second emission control drain electrode D6 is a second emission control drain area in the second emission control semiconductor layer A6 which is doped with impurities. The second emission control drain electrode D6 is connected to the anode electrode of the OLED by using a second contact metal CM2 formed through a sixth contact hole 56 and a via hole VIA, both of which are filled with the second contact metal CM2. The second emission control gate electrode G6 is formed as a portion of the emission control line 15.

The second initialization TFT T7 includes a second initialization semiconductor layer A7, a second initialization gate electrode G7, a second initialization source electrode S7, and a second initialization drain electrode D7. The second initialization source electrode S7 is a second initialization source area in the second initialization semiconductor layer A7 which is doped with impurities and the second initialization drain electrode D7 is a second initialization drain area in the second initialization semiconductor layer A7 which is doped with impurities. The second initialization drain electrode D7 is connected to the initialization voltage line 20 via the first contact metal CM1 formed through the fourth contact hole 54. The second initialization source electrode S7 is connected to the anode electrode of the OLED via the second contact metal CM2 formed in the sixth contact hole 56 and a third contact metal CM3 that is connected to the second contact metal CM2. The second initialization gate electrode G7 is formed as a portion of the third scan line 34.

The first electrode C1 of the first storage capacitor Cst1 is directly connected to the driving gate electrode G1 and may be connected to the third electrode C3 of the second storage capacitor Cst2 via the first contact hole 51. Also, the first electrode C1 of the first storage capacitor Cst1 is connected to the first initialization TFT T4 and the compensation TFT T3 via the third electrode C3 and the first and second contact holes 51 and 52. The first electrode C1 may have a floating electrode form and may overlap the driving semiconductor layer A1.

Although the second electrode C2 of the first storage capacitor Cst1 overlaps the first electrode C1, the second electrode C2 does not completely cover the first electrode C1. The second electrode C2 includes the opening OP that exposes a portion of the first electrode C1. The opening OP may be the first contact hole 51. The second electrodes C2 that are formed in the two adjacent pixels 1 may be connected to each other. The driving voltage line 26 may be connected to the center of the second electrodes C2 that are formed in the two adjacent pixels 1 via a seventh contact hole 57 and thus substantially simultaneously transmits the first power voltage ELVDD to the two adjacent pixels 1. That is, the two adjacent pixels 1 receive the driving voltage ELVDD from a single driving voltage line 26 by using the second electrodes C2 that are formed in the two adjacent pixels 1.

The third electrode C3 of the second storage capacitor Cst2 is connected to the first electrode C1 of the first storage capacitor Cst1 via the first contact hole 51. Also, the third electrode C3 is connected to the compensation TFT T3 and the first initialization TFT T4 via the second contact hole 52. The third electrode C3 and the data line 16 may be formed on the same layer and the third electrode C3 may have a floating electrode form. The third electrode C3 may overlap a portion of the second electrode C2 of the first storage capacitor Cst1, but does not overlap the first electrode C1. Therefore, as illustrated in FIG. 3B, the second storage capacitor Cst2 may be separated from the first storage capacitor Cst1, and the second storage capacitor Cst2 may have a different storage capacity than the storage capacity of the first storage capacitor Cst1. Accordingly, it is possible to solve the problem of decreasing storage capacity due to increasing resolution in OLED displays. Thus, the storage capacity in the pixel may be maintained at a similar level to lower resolution displays.

The fourth electrode C4 of the second storage capacitor Cst2 overlaps the third electrode C3. The fourth electrode C4 is connected to the initialization voltage line 20 that is formed on the same layer as the fourth electrode C4. In particular, the initialization voltage line 20 and the fourth electrode C4 may be formed integrally. Since the initialization voltage line 20 is connected to the first and second initialization TFTs T4 and T7 via the fourth contact hole 54, the fourth electrode C4 may also be connected to the first and second initialization TFTs T4 and T7.

The first to third scan lines 14, 24, and 34 and the emission control line 15 are all formed on the same layer and extend in the second direction. The first to third scan lines 14, 24, and 34 and the emission control line 15 may be formed between semiconductor layers and first gate electrodes such that the first to third scan lines 14, 24, and 34 and the emission control line 15 are insulated from the semiconductor layers and the first gate electrodes.

The data line 16 is formed on the same layer as the third electrode C3 of the second storage capacitor Cst2 and extends in the first direction.

The driving voltage line 26 and the initialization voltage line 20 are formed on the same layer as the fourth electrode C4 of the second storage capacitor Cst2 and extend in the first direction.

The two adjacent pixels 1 share the driving voltage line 26. In particular, the driving voltage line 26 is formed between the two adjacent pixels 1 and extends in the first direction. The driving voltage line 26 is connected to the first emission control TFT T5, which is included in each of the two adjacent pixels 1, via the fifth contact hole 55, and to the second electrode C2 of the first storage capacitor Cst1, which is commonly included in the two adjacent pixels 1, via the seventh contact hole 57. According to the present embodiment, the two adjacent pixels 1 share the driving voltage line 26, and thus the two adjacent pixels 1 may form a symmetrical structure about the driving voltage line 26. Accordingly, the number of driving voltage lines 26 may be reduced, and thus, it is possible to obtain more design space due to the reduction.

Figure 4:
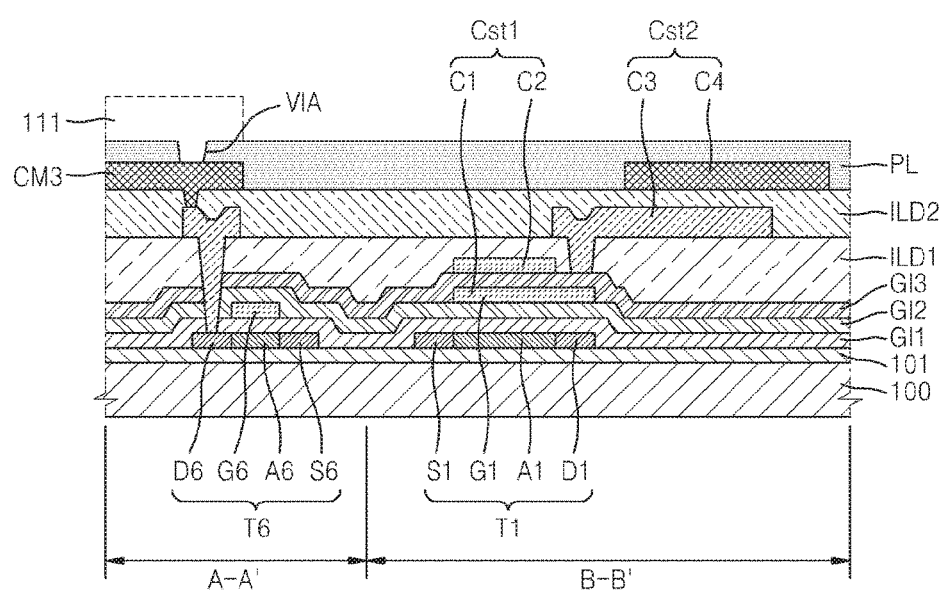
FIG. 4 is a cross-sectional view taken along lines A-A' and B-B' of FIG. 3A.

FIG. 4 is a cross-sectional view taken along lines A-A' and B-B' of FIG. 3A. FIG. 4 illustrates the driving TFT T1 and the second emission control TFT T6 from among the plurality of TFTs, the first storage capacitor Cst1, and the second storage capacitor Cst2.

Among elements, such as lines, electrodes, and semiconductor layers, in a cross-section taken along lines A-A' and B-B', elements that have little relation to the driving TFT T1, the second emission control TFT T6, the first storage capacitor Cst1, and the second storage capacitor Cst2 are omitted in FIG. 4 so as to clarify features of the embodiments. Therefore, FIG. 4 may be different from an actual cross-sectional view taken along lines A-A' and B-B' of FIG. 3A.

Referring to FIG. 4, a buffer layer 101 is formed on a substrate 100. The buffer layer 101 functions as a barrier layer and/or blocking layer for preventing impurity ions from spreading, blocking penetration of moisture or external air, and planarizing the surface of the substrate.

The driving semiconductor layer A1 of the driving TFT T1 and the second emission control semiconductor layer A6 of the second emission control TFT T6 are formed on the buffer layer 101. The driving and second emission control semiconductor layers A1 and A6, which are formed of polysilicon, include a channel area that is not doped with impurities, and a source area and a drain area which are respectively formed on both sides of the channel area and doped with impurities. In this case, the impurities differ according to the type of TFT, and may be N-type impurities or P-type impurities. Although not illustrated, the driving semiconductor layer A1 and the second emission control semiconductor layer A6 may simultaneously formed while being connected to the switching semiconductor layer A2 of the switching TFT T2, the compensation semiconductor layer A3 of the compensation TFT T3, the first initialization semiconductor layer A4 of the first initialization TFT T4, the first emission control semiconductor layer A5 of the first emission control TFT T5, and the second initialization semiconductor layer A7 of the second initialization TFT T7.

A first gate insulating layer GI1 is formed on the entire surface of the substrate 100 to cover the driving and second emission control semiconductor layers A1 and A6. The first gate insulating layer GI1 may be a single layer or a plurality of layers formed of an inorganic material such as silicon oxide or silicon nitride. The first gate insulating layer GI1 insulates the semiconductor layers from the first gate electrodes. According to an embodiment, the first gate insulating layer GI1 is thicker than a second gate insulating layer GI2 or a third gate insulating layer GI3 which will be described below. The first gate insulating layer GI1 insulates the semiconductor layers of the switching TFT T2, the compensation TFT T3, the first initialization TFT T4, the first emission control TFT T5, the second emission control TFT T6, and the second initialization TFT T7 from the first gate electrodes. The "first gate electrodes" will be described in detail below. When the first gate insulating layer GI1 is thick, a parasitic capacitance between the semiconductor layers and the first gate electrodes may be reduced, and thus, stains may be reduced or removed from images displayed by the OLED display.

The second emission control gate electrode G6 of the second emission control TFT T6 is formed on the first gate insulating layer GI1. Also, although not illustrated, the switching gate electrode G2 of the switching TFT T2, the compensation gate electrode G3 of the compensation TFT T3, the first initialization gate electrode G4 of the first initialization TFT T4, the second initialization gate electrode G7 of the second initialization TFT T7, and the first emission control gate electrode G5 of the first emission control TFT T5 are simultaneously formed with the second emission control gate electrode G6. The "first gate electrodes" as used in this embodiment refers to the switching gate electrode G2, the compensation gate electrode G3, the first initialization gate electrode G4, the first emission control gate electrode G5, the second emission control gate electrode G6, and the second initialization gate electrode G7 which are formed of a first gate line GL1 material. The first gate electrodes are defined by semiconductor layers that overlap the first to third scan lines 14, 24, and 34 and the emission control line 15. Therefore, a process of forming the first gate electrodes is thus a process of forming the first to third scan lines 14, 24, and 34 and the emission control line 15. The first gate line GL1 material may include at least one metal selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The second gate insulating layer GI2 may be stacked on the entire surface of the substrate 100 to cover the first gate electrodes. The second gate insulating layer GI2 may be a single layer or a plurality of layers formed of an inorganic material such as silicon oxide or silicon nitride. The second gate insulating layer GI2 insulates the first and second gate electrodes from each other. The "second gate electrodes" will be described in detail below. The second gate insulating layer GI2 is thinner than the first gate insulating layer GI1.

The driving gate electrode G1 of the driving TFT T1 and the first electrode C1 of the first storage capacitor Cst1 connected thereto are formed on the second gate insulating layer GI2. The "second gate electrodes" as used in this embodiment refers to the driving gate electrode G1 and the first electrode C1 that are formed of a second gate line GL2 material. Similar to the first gate line GL1 material, the second gate line GL2 material may also include at least one metal selected from the group of Al, Pt, Pd, Ag, Mg, Au, Ni, Nd, Ir, Cr, Li, Ca, Mo, Ti, W, and Cu.

According to an embodiment, in the driving TFT T1, the first and second gate insulating layers GI1 and GI2 are formed between the driving semiconductor layer A1 and the driving gate electrode G1 so that the driving semiconductor layer A1 and the driving gate electrode G1 are insulated from each other. Therefore, by forming a thick insulating layer between the driving semiconductor layer A1 and the driving gate electrode G1, the parasitic capacitance between the driving semiconductor layer A1 and the driving gate electrode G1 is reduced. Accordingly, the gate voltage Vgs, which is applied to the driving gate electrode G1, increases to a wider driving range, and the magnitude of the gate voltage Vgs may be changed so that light emitted from the OLED has a finer gradation in gray scales. That is, since the driving TFT T1 has a wide driving range by forming a thick insulating layer between the driving semiconductor layer A1 and the driving gate electrode G1, the driving semiconductor layer A1 does not have to be formed relatively long to increase the driving range of the driving TFT T1. Therefore, the driving semiconductor layer A1 may be designed to be short, and thus, the entire size of the driving TFT T1, and more particularly, the size of the driving gate electrode G1 and the overall size occupied by the each of the pixels can be reduced. Thus, the resolution of the OLED display can be increased.

The third gate insulating layer GI3 is stacked on the entire surface of the substrate 100 to cover the second gate electrodes. The third gate insulating layer GI3 may be a single layer or a plurality of layers formed of an inorganic material such as silicon oxide or silicon nitride. The third gate insulating layer GI3 insulates the second gate electrodes and third gate electrode, and functions as a dielectric layer between the first and second electrodes C1 and C2 of the first storage capacitor Cst1. The "third gate electrode" will be described in detail below. The third gate insulating layer GI3 is thinner than the first gate insulating layer GI1 so as to increase the storage capacity of the first storage capacitor Cst1.

The second electrode C2 of the first storage capacitor Cst1 is formed on the third gate insulating layer GI3. The "third gate electrode" as used in this embodiment refers to the second electrode C2 that is formed of a third gate line GL3 material. Similar to the first and second gate lines GL1 and GL2 materials, the third gate line GL3 material may also include at least one metal selected from the group of Al, Pt, Pd, Ag, Mg, Au, Ni, Nd, Ir, Cr, Li, Ca, Mo, Ti, W, and Cu.

According to an embodiment, the first storage capacitor Cst1 overlaps the driving TFT T1. In particular, since the driving gate electrode G1 and the first electrode C1 are integrally formed in some embodiments, the first storage capacitor Cst1 overlaps the driving TFT T1. However, as described above, when the size of the driving TFT T1, and more particularly, the size of the driving gate electrode G1, is reduced in order to manufacture increase the resolution of the OLED display, the size of the first electrode C1 is also reduced. Thus, the storage capacity of the first storage capacitor Cst1 is reduced according to Equation 1 below. In Equation 1, "C" is the storage capacity of a storage capacitor, "ε" is the dielectric constant, "A" is the area the overlap between the electrodes of the capacitor, and "d" is the distance between the overlapping electrodes.

$$C = \varepsilon \frac{A}{d} \qquad \text{[Equation 1]}$$

A substantially uniform storage capacity should be maintained in each pixel so that the gray scales can be substantially consistently displayed in the OLED display without any faults. Therefore, a design for maintaining or supplementing the reduced storage capacity of the first storage capacitor Cst1 may be necessary. According to an embodiment, the second storage capacitor Cst2 is separately formed from the first storage capacitor Cst1 so as to maintain or supplement the storage capacity of first storage capacitor Cst1 in each pixel.

A first interlayer insulating layer ILD1 is formed on the entire surface of the substrate 100 to cover the second electrode C2 of the first storage capacitor Cst1. The first interlayer insulating layer ILD1 may be formed of an organic insulating material, an inorganic insulating material, or have a multi-layer structure in which organic and inorganic insulating materials are alternately formed. For example, the inorganic insulating material may include a metal oxide or a metal nitride, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first interlayer insulating layer ILD1 insulates the third gate electrode from first data electrodes. The "first data electrodes" will be described in detail below.

The third electrode C3 of the second storage capacitor Cst2 is formed on the first interlayer insulating layer ILD1. Although not illustrated, the data line 16, and the first and second contact metals CM1 and CM2 are simultaneously formed with the third electrode C3. The third electrode C3 is connected to the first electrode C1 via the first contact hole 51 formed in the third gate insulating layer GI3 and the first interlayer insulating layer ILD1. The third electrode C3 is connected to the compensation TFT T3 and the first initialization TFT T4 via the second contact hole 52 formed in the first to third gate insulating layers GI1 to GI3, and the first interlayer insulating layer ILD1. The "first data electrodes" as used in this embodiment refers to the third electrode C3, the data line 16, and the first and second contact metals CM1 and CM2 which are formed of a first data line DAT1 material. The first data line DAT1 material may include at least one metal selected from the group of Al, Pt, Pd, Ag, Mg, Au, Ni, Nd, Ir, Cr, Li, Ca, Mo, Ti, W, and Cu.

According to some embodiments, the third electrode C3 does not overlap the first storage capacitor Cst1. Therefore, the first and second storage capacitors Cst1 and Cst2 may be separated. Accordingly, the storage capacity in each pixel may be substantially equal to the sum of the storage capacities of the first and second storage capacitors Cst1 and Cst2.

A second interlayer insulating layer ILD2 is stacked on the entire surface of the substrate 100 to cover the third electrode C3. The second interlayer insulating layer ILD2 may be formed of an organic insulating material, an inorganic insulating material, or have a multi-layer structure in which organic and inorganic insulating materials are alternately formed. The second interlayer insulating layer ILD2 insulates the first data electrode and second data electrodes and functions as a dielectric layer of the second storage capacitor Cst2. The "second data electrodes" will be described in detail below.

The fourth electrode C4 of the second storage capacitor Cst2 is formed on the second interlayer insulating layer ILD2. Although not illustrated, the initialization voltage line 20 that is connected to the fourth electrode C4, the driving voltage line 26, and the third contact metal CM3, are simultaneously formed with the fourth electrode C4. The fourth electrode C4 and the initialization voltage line 20 may be integrally formed, and the fourth electrode C4 is connected to the first and second initialization TFTs T4 and T7 by using the first contact metal CM1 of the fourth contact hole 54. The "second data electrodes" as used in this embodiment refers to the fourth electrode C4, the initialization voltage line 20, the driving voltage line 26, and the third contact metal CM3 which are formed of a second data line DAT2 material. The second data line DAT2 material may include at least one metal selected from the group of Al, Pt, Pd, Ag, Mg, Au, Ni, Nd, Ir, Cr, Li, Ca, Mo, Ti, W, and Cu.

A protection layer PL is formed on the entire surface of the substrate 100 to cover the fourth electrode C4. An anode electrode 111 is formed on the protection layer PL. The anode electrode 111 is connected to the second and third contact metals CM2 and CM3 formed in the sixth contact hole 56 via the via hole VIA, and thus is connected to the second emission control drain electrode D6 and the second initialization source electrode S7.

Although not illustrated in FIG. 3A, the anode electrode 111 of the OLED is illustrated in FIG. 4 for the convenience of description. The OLED includes the anode electrode 111 and a cathode electrode (not shown) facing the anode electrode 111. An intermediate layer (not shown) that includes an organic emission layer is provided between the anode electrode 111 and the cathode electrode.

In FIGS. 3A and 4, the source and drain electrodes of the TFTs that are not connected to other lines are formed on the same layer as corresponding semiconductor layers. That is, the source and drain electrodes of each of the TFTs may be selectively formed of polysilicon that is doped with a doping material. However, the embodiments of the described technology are not limited thereto. The TFTs according to another embodiment include source and drain electrodes that are formed on a different layer from the corresponding semiconductor layers and are connected to source and drain areas of the corresponding semiconductor layers via a contact hole.

Figure 5:
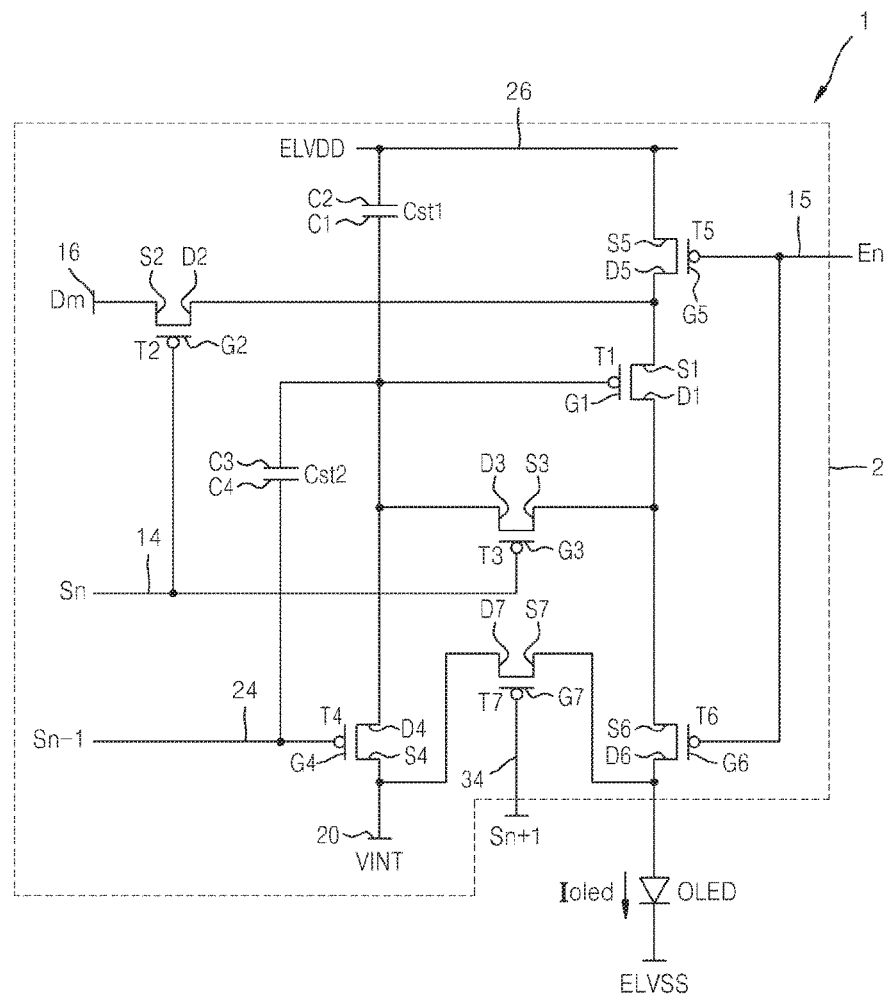
FIG. 5 is an equivalent circuit diagram of a pixel of an OLED display according to another embodiment.

FIG. 5 is an equivalent circuit diagram of a pixel 1 of the OLED display 1000, according to another embodiment.

The pixel 1 of the OLED display 1000 of the embodiment of FIG. 5 includes a pixel circuit 2 that includes a plurality of TFTs T1 to T7 and two storage capacitors, namely, first and second storage capacitors Cst1 and Cst2. The pixel 1 includes an OLED that receives a driving current Ioled via the pixel circuit 2 and thus emits light.

The plurality of TFTs T1 to T7 include a driving TFT T1, a switching TFT T2, a compensation TFT T3, a first initialization TFT T4, a first emission control TFT T5, a second emission control TFT T6, and a second initialization TFT T7.

The pixel 1 includes a first scan line 14 that transmits a first scan signal Sn to the switching TFT T2 and the compensation TFT T3, a second scan line 24 that transmits a second scan signal Sn−1 to the first initialization TFT T4, and a third scan line 34 that transmits a third scan signal Sn+1 to the second initialization TFT T7. The pixel 1 also includes an emission control line 15 that transmits an emission control signal En to the first emission control TFT T5 and the second emission control TFT T6, a data line 16 that intersects the first scan line 14 and transmits a data signal Dm, a driving voltage line 26 that transmits the first power voltage ELVDD, and an initialization voltage line 20 that transmits an initialization voltage VINT to initialize the driving TFT T1.

A gate electrode G1 of the driving TFT T1 is connected to a first electrode C1 of the first storage capacitor Cst1 and a third electrode C3 of the second storage capacitor Cst2. A source electrode S1 of the driving TFT T1 is connected to the driving voltage line 26 via the first emission control TFT T5. A drain electrode D1 of the driving TFT T1 is electrically connected to an anode electrode of the OLED via the second emission control TFT T6. The driving TFT T1 receives the data signal Dm based on a switching operation of the switching TFT T2 and supplies a driving current Ioled to the OLED.

A gate electrode G2 of the switching TFT T2 is connected to the first scan line 14. A source electrode S2 of the switching TFT T2 is connected to the data line 16. A drain electrode D2 of the switching TFT T2 is connected to the source electrode S1 of the driving TFT T1 and to the driving voltage line 26 via the first emission control TFT T5. The switching TFT T2 is turned on based on the first scan signal Sn received via the first scan line 14 and performs a switching operation in which the data signal Dm received via the data line 16 is transmitted to the source electrode S1 of the driving TFT T1.

A gate electrode G3 of the compensation TFT T3 is connected to the first scan line 14. A source electrode S3 of the compensation TFT T3 is connected to the drain electrode D1 of the driving TFT T1 and to the anode electrode of the OLED via the second emission control TFT T6. A drain electrode D3 of the compensation TFT T3 is connected to the first electrode C1 of the first storage capacitor Cst1, the third electrode C3 of the second storage capacitor Cst2, a drain electrode D4 of the first initialization TFT T4, and the gate electrode G1 of the driving TFT T1. The compensation TFT T3 is turned on based on the first scan signal Sn received via the first scan line 14 and connects the driving TFT T1 to form a diode connection by connecting the gate electrode G1 and the drain electrode D1 of the driving TFT T1.

A gate electrode G4 of the first initialization TFT T4 is connected to the second scan line 24. A source electrode S4 of the first initialization TFT T4 is connected to the initialization voltage line 20. The drain electrode D4 of the first initialization TFT T4 is connected to the first electrode C1 of the first storage capacitor Cst1, the third electrode C3 of the second storage capacitor Cst2, the drain electrode D3 of the compensation TFT T3, and the gate electrode G1 of the driving TFT T1. The first initialization TFT T4 is turned on based on the second scan signal Sn−1 received via the second scan line 24 and performs an initialization operation in which the initialization voltage VINT is transmitted to the gate electrode G1 of the driving TFT T1 and thus initializes a voltage of the gate electrode G1 of the driving TFT T1.

A gate electrode G5 of the first emission control TFT T5 is connected to the emission control line 15. A source electrode S5 of the first emission control TFT T5 is connected to the driving voltage line 26. A drain electrode D5 of the first emission control TFT T5 is connected to the source electrode S1 of the driving TFT T1 and the drain electrode D2 of the switching TFT T2.

A gate electrode G6 of the second emission control TFT T6 is connected to the emission control line 15. A source electrode S6 of the second emission control TFT T6 is connected to the drain electrode D1 of the driving TFT T1 and the source electrode S3 of the compensation TFT T3. A drain electrode D6 of the second emission control TFT T6 is electrically connected to the anode electrode of the OLED. The first and second emission control TFTs T5 and T6 are substantially simultaneously turned on based on the emission control signal En received via the emission control line 15. Then, the first power voltage ELVDD is transmitted to the OLED, and thus, the driving current Ioled flows in the OLED.

A gate electrode G7 of the second initialization TFT T7 is connected to the third scan line 34. A source electrode S7 of the second initialization TFT T7 is connected to the anode electrode of the OLED. A drain electrode D7 of the second initialization TFT T7 is connected to the initialization voltage line 20. The second initialization TFT T7 is turned on based on the third scan signal Sn+1 received via the third scan line 34 and initializes the anode electrode of the OLED.

A second electrode C2 of the first storage capacitor Cst1 is connected to the driving voltage line 26. The first electrode C1 of the first storage capacitor Cst1 is connected to the gate electrode G1 of the driving TFT T1, the third electrode C3 of the second storage capacitor Cst2, the drain electrode D3 of the compensation TFT T3, and the drain electrode D4 of the first initialization TFT T4.

The third electrode C3 of the second storage capacitor Cst2 is connected to the gate electrode G1 of the driving TFT T1, the first electrode C1 of the first storage capacitor Cst1, the drain electrode D3 of the compensation TFT T3, and the drain electrode D4 of the first initialization TFT T4. A fourth electrode C4 of the second storage capacitor Cst2 is connected to the second scan line 24.

The second power voltage ELVSS is applied to a cathode electrode of the OLED. The OLED displays an image by receiving the driving current Ioled from the driving TFT T1 and thus emits light.

Figure 6A:
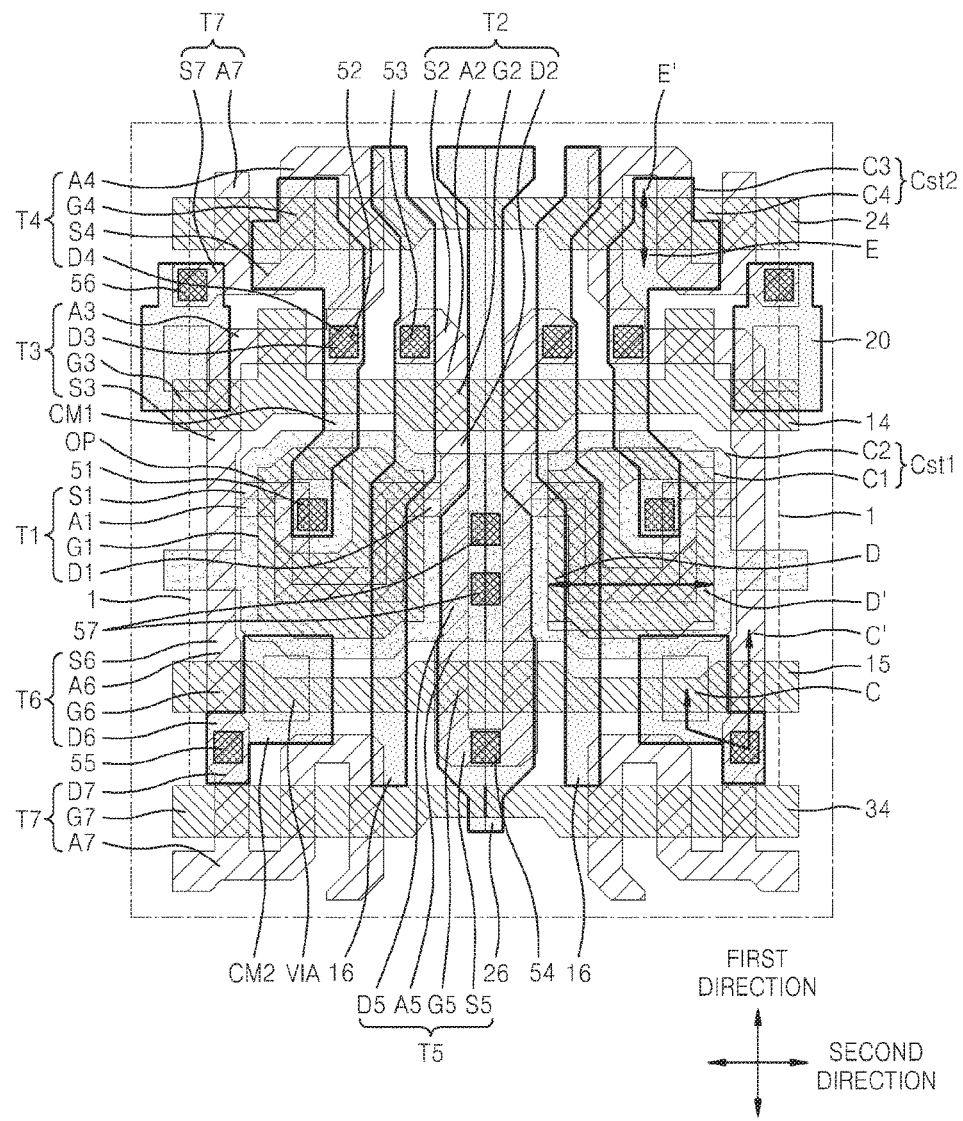
FIGS. 6A and 6B are schematic plan views of the pixel of FIG. 5.
Figure 6B:
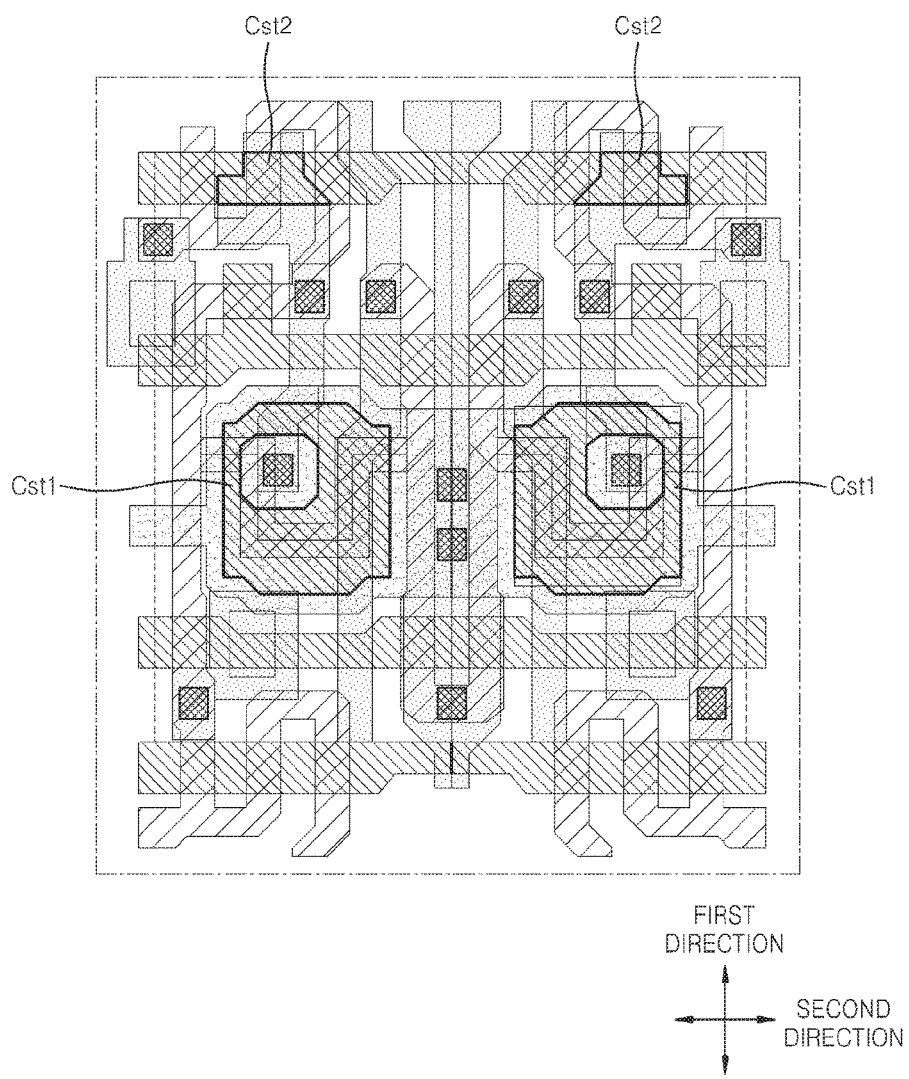

FIGS. 6A and 6B are schematic plan views of the pixel 1 of FIG. 5. FIGS. 6A and 6B each illustrate two adjacent pixels 1.

Referring FIG. 6A, the pixel 1 includes the driving TFT T1, the switching TFT T2, the compensation TFT T3, the first initialization TFT T4, the first emission control TFT T5, the second emission control TFT T6, the second initialization TFT T7, the first storage capacitor Cst1, and the second storage capacitor Cst2. The OLED is omitted in FIG. 6A.

The driving TFT T1 includes a driving semiconductor layer A1, a driving gate electrode G1, a driving source electrode S1, and a driving drain electrode D1. The driving source electrode S1 is a driving source area in the driving semiconductor layer A1 which is doped with impurities and the driving drain electrode D1 is a driving drain area in the driving semiconductor layer A1 which is doped with impurities. The driving gate electrode G1 is connected to the first electrode C1 of the first storage capacitor Cst1, the third electrode C3 of the second storage capacitor Cst2, a compensation drain electrode D3 of the compensation TFT T3, and a first initialization drain electrode D4 of the first initialization TFT T4. In particular, the driving gate electrode G1 and the first electrode C1 are integrally formed on the same layer. The driving gate electrode G1 and the third electrode C3 are connected by using a first contact metal CM1 formed in a first contact hole 51. The driving gate electrode G1, the compensation drain electrode D3, and the first initialization drain electrode D4 are connected by using the first contact metal CM1 formed in each of the first contact hole 51 and a second contact hole 52.

The switching TFT T2 includes a switching semiconductor layer A2, a switching gate electrode G2, a switching source electrode S2, and a switching drain electrode D2. The switching source electrode S2 is a switching source area in the switching semiconductor layer A2 which is doped with impurities and the switching drain electrode D2 is a switching drain area in the switching semiconductor layer A2 which is doped with impurities. The switching source electrode S2 is connected to the data line 16 via a third contact hole 53. The switching drain electrode D2 is connected to the driving TFT T1 and the first emission control TFT T5. The switching gate electrode G2 is formed as a portion of the first scan line 14.

The compensation TFT T3 includes a compensation semiconductor layer A3, a compensation gate electrode G3, a compensation source electrode S3, and the compensation drain electrode D3. The compensation source electrode S3 is a compensation source area in the compensation semiconductor layer A3 which is doped with impurities and the compensation drain electrode D3 is a compensation drain area in the compensation semiconductor layer A3 which is doped with impurities. The compensation gate electrode G3 forms a dual gate electrode by using a portion of the first scan line 14 and a portion of a line that protrudes and extends from the first scan line 14, and thus prevents leakage current.

The first initialization TFT T4 includes a first initialization semiconductor layer A4, a first initialization gate electrode G4, a first initialization source electrode S4, and the first initialization drain electrode D4. The first initialization source electrode S4 is a first initialization source area in the first initialization semiconductor layer A4 which is doped with impurities, and the first initialization drain electrode D4 is a first initialization drain area in the first initialization semiconductor layer A4 which is doped with impurities. The first initialization source electrode S4 may be connected to the compensation TFT T3. The first initialization drain electrode D4 may be connected to a fourth electrode C4 of the second storage capacitor Cst2 via the second contact hole 52, and to the driving gate electrode G1 and the first electrode C1 by using the first contact metal CM1 formed in the first and second contact holes 51 and 52. The first initialization gate electrode G4 is formed by a portion of the second scan line 24. A dual gate electrode is formed by overlapping the first initialization semiconductor layer A4 and the first initialization gate electrode G4 twice.

The first emission control TFT T5 includes a first emission control semiconductor layer A5, a first emission control gate electrode G5, a first emission control source electrode S5, and a first emission control drain electrode D5. The first emission control source electrode S5 is a first emission control source area in the first emission control semiconductor layer A5 which is doped with impurities and the first emission control drain electrode D5 is a first emission control drain area in the first emission control semiconductor layer A5 which is doped with impurities. The first emission control source electrode S5 may be connected to the driving voltage line 26 via a fourth contact hole 54. The first emission control gate electrode G5 is formed as a portion of the emission control line 15.

The second emission control TFT T6 includes a second emission control semiconductor layer A6, a second emission control gate electrode G6, a second emission control source electrode S6, and a second emission control drain electrode D6. The second emission control source electrode S6 is a second emission control source area in the second emission control semiconductor layer A6 which is doped with impurities and the second emission control drain electrode D6 is a second emission control drain area in the second emission control semiconductor layer A6 which is doped with impurities. The second emission control drain electrode D6 is connected to the anode electrode of the OLED via a second contact metal CM2 formed through a fifth contact hole 55 and a via hole VIA, both of which are filled with the second contact metal CM2. The second emission control gate electrode G6 is formed by a portion of the emission control line 15.

The second initialization TFT T7 includes a second initialization semiconductor layer A7, a second initialization gate electrode G7, a second initialization source electrode S7, and a second initialization drain electrode D7. The second initialization source electrode S7 is a second initialization source area in the second initialization semiconductor layer A7 which is doped with impurities and the second initialization drain electrode D7 is a second initialization drain area in the second initialization semiconductor layer A7 which is doped with impurities. The second initialization source electrode S7 may be connected to the initialization voltage line 20 via a sixth contact hole 56, and the second initialization drain electrode D7 may be connected to the anode electrode of the OLED by using the second contact metal CM2 formed through the fifth contact hole 55 and the via hole VIA, both of which are filled with the second contact metal CM2. The second initialization gate electrode G7 is formed as a portion of the third scan line 34.

The first electrode C1 of the first storage capacitor Cst1 is directly connected to the driving gate electrode G1 and may be connected to the third electrode C3 of the second storage capacitor Cst2 via the first contact metal CM1 formed in the first contact hole 51. Also, the first electrode C1 of the first storage capacitor Cst1 is connected to the first initialization TFT T4 and the compensation TFT T3 by using the first contact metal CM1 formed in the first and second contact holes 51 and 52. The first electrode C1 may have a floating electrode form and may overlap the driving semiconductor layer A1.

Although the second electrode C2 of the first storage capacitor Cst1 overlaps the first electrode C1, the second electrode C2 does not completely cover the first electrode C1. The second electrode C2 includes an opening OP that exposes a portion of the first electrode C1. The opening OP may be the first contact hole 51. The second electrodes C2 that are formed in the two adjacent pixels 1 may be connected to each other. The driving voltage line 26 may be connected to the center of the second electrodes C2 that are formed in the two adjacent pixels 1 via a seventh contact hole 57, and thus may substantially simultaneously transmit the first power voltage ELVDD to the two adjacent pixels 1. That is, the two adjacent pixels 1 receive the driving voltage ELVDD from a single driving voltage line 26 by using the second electrodes C2 that are formed in the two adjacent pixels 1.

The third electrode C3 of the second storage capacitor Cst2 is connected to the first electrode C1 of the first storage capacitor Cst1 and the driving gate electrode G1 via the first contact metal CM1 formed in the first contact hole 51. Also, the third electrode C3 is connected to the compensation drain electrode D3 and the first initialization drain electrode D4 via the second contact hole 52. The third electrode C3 and the data line 16 may be formed on the same layer. The third electrode C3 is separated from the first storage capacitor Cst1 and does not overlap the first storage capacitor Cst1. Therefore, as illustrated in FIG. 6B, the second storage capacitor Cst2 may be separated from the first storage capacitor Cst1 and the second storage capacitor Cst2 may have a separate storage capacity different from the storage capacity of the first storage capacitor Cst1. Accordingly, it is possible to solve the problem of decreasing storage capacity in pixels that may occur due to an increase in OLED display resolution. Thus, the storage capacity in each of the pixels may be maintained with a value that is similar to that of the standard OLED display.

The fourth electrode C4 of the second storage capacitor Cst2 overlaps the third electrode C3. The fourth electrode C4 and the second scan line 24 are formed on the same layer. In particular, the fourth electrode C4 is formed by a portion of the second scan line 24. Since the second scan line 24 forms the first initialization gate electrode G4, the fourth electrode C4 may be connected to the first initialization TFT T4.

The first to third scan lines 14, 24, and 34 and the emission control line 15 are all formed on the same layer and extend in the second direction. The first to third scan lines 14, 24, and 34 and the emission control line 15 may be formed on the same layer as the first electrode C1 of the first storage capacitor Cst1 and the fourth electrode C4 of the second storage capacitor Cst2.

The data line 16, the driving voltage line 26, and the initialization voltage line 20 are formed on the same layer as the third electrode C3 of the second storage capacitor Cst2 and extend in the first direction.

The two adjacent pixels 1 share the driving voltage line 26. In particular, the driving voltage line 26 is formed between the two adjacent pixels 1 and extends in the first direction. The driving voltage line 26 is connected to the first emission control TFT T5, which is included in each of the two adjacent pixels 1, via the fifth contact hole 55, and to the second electrode C2 of the first storage capacitor Cst1, which is commonly included in the two adjacent pixels 1, via the seventh contact hole 57. According to the embodiment of FIGS. 6A and 6B, the two adjacent pixels 1 share the driving voltage line 26, and thus the two adjacent pixels 1 may form a substantially symmetrical structure about the driving voltage line 26. Accordingly, the number of driving voltage lines 26 may be reduced, and thus, it is possible to obtain more design space due to this reduction.

Figure 7:
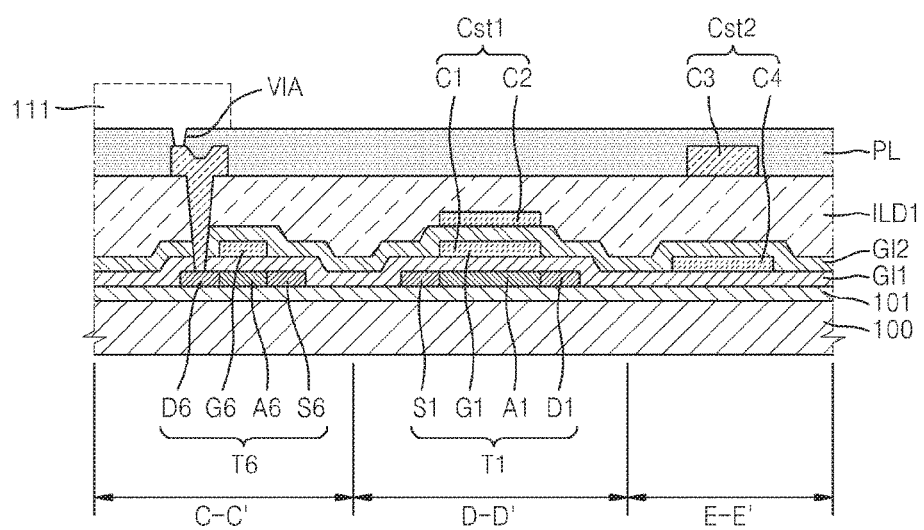
FIG. 7 is a cross-sectional view taken along lines C-C', D-D', and E-E' of FIG. 6A.

FIG. 7 is a cross-sectional view taken along lines C-C', D-D', and E-E' of FIG. 6A. FIG. 7 illustrates the driving TFT T1 and the second emission control TFT T6, the first storage capacitor Cst1, and the second storage capacitor Cst2.

Among elements such as lines, electrodes, and semiconductor layers, in a cross-section taken along lines A-A' and B-B', elements that have little relation to the driving TFT T1, the second emission control TFT T6, the first storage capacitor Cst1, and the second storage capacitor Cst2 are omitted in FIG. 7 so as to clarify the features of the embodiment illustrated in FIGS. 6A and 6B. Therefore, FIG. 7 may be different from an actual cross-sectional view taken along lines C-C', D-D', and E-E' of FIG. 6A.

Referring to FIG. 7, a buffer layer 101 is formed on a substrate 100. The buffer layer 101 functions as a barrier layer and/or blocking layer for preventing impurity ions from spreading, blocking penetration of moisture or external air, and planarizing the surface of the substrate 100.

The driving semiconductor layer A1 of the driving TFT T1 and the second emission control semiconductor layer A6 of the second emission control TFT T6 are formed on the buffer layer 101. The driving and second emission control semiconductor layers A1 and A6, which are formed of polysilicon, include a channel area that is not doped with impurities, and a source area and a drain area which are respectively formed on both sides of the channel area and doped with impurities. In the embodiment of FIG. 7, the impurities differ according to the type of TFT, and may be N-type impurities or P-type impurities. Although not illustrated, the driving semiconductor layer A1 and the second emission control semiconductor layer A6 may be simultaneously formed while being connected to the switching semiconductor layer A2 of the switching TFT T2, the compensation semiconductor layer A3 of the compensation TFT T3, the first initialization semiconductor layer A4 of the first initialization TFT T4, the second initialization semiconductor layer A7 of the second initialization TFT T7, and the first emission control semiconductor layer A5 of the first emission control TFT T5.

A first gate insulating layer GI1 is formed on the entire surface of the substrate 100 to cover the driving and second emission control semiconductor layers A1 and A6. The first gate insulating layer GI1 may be a single layer or layers formed of an inorganic material such as silicon oxide or silicon nitride. The first gate insulating layer GI1 insulates the semiconductor layers from the first gate electrodes. According to an embodiment, the first gate insulating layer GI1 is thicker than a second gate insulating layer GI2 which will be described below. The first gate insulating layer GI1 insulates the semiconductor layers of the driving TFT T1, the switching TFT T2, the compensation TFT T3, the first initialization TFT T4, the first emission control TFT T5, the second emission control TFT T6, and the second initialization TFT T7 from the first gate electrodes. The "first gate electrodes" will be described in detail below. When the first gate insulating layer GI1 is thick, a parasitic capacitance formed between the semiconductor layers and the first gate electrodes may be reduced, and thus, stains may be reduced or removed from images displayed by the OLED display. In addition, in the driving TFT T1, the parasitic capacitance between the driving semiconductor layer A1 and the driving gate electrode G1 is reduced, and thus, a gate voltage Vgs, which is applied to the driving gate electrode G1, has a wide driving range. Accordingly, a magnitude of the gate voltage Vgs may be changed so that light emitted from the OLED has more various gray scales.

The second emission control gate electrode G6 of the second emission control TFT T6, the driving gate electrode G1 of the driving TFT T1, the first electrode C1 of the first storage capacitor Cst1, and the fourth electrode C4 of the second storage capacitor Cst2 are formed on the first gate insulating layer GI1. Also, although not illustrated, the switching gate electrode G2 of the switching TFT T2, the compensation gate electrode G3 of the compensation TFT T3, the first initialization gate electrode G4 of the first initialization TFT T4, the second initialization gate electrode G7 of the second initialization TFT T7, and the first emission control gate electrode G5 of the first emission control TFT T5 are simultaneously formed with the second emission control gate electrode G6, the driving gate electrode G1, the first electrode C1, and the fourth electrode C4. The "first gate electrodes" as used in this embodiment refers to the driving gate electrode G1, the switching gate electrode G2, the compensation gate electrode G3, the first initialization gate electrode G4, the first emission control gate electrode G5, the second emission control gate electrode G6, the second initialization gate electrode G7, the first electrode C1, and the fourth electrode C4 which are formed of a first gate line GL1 material.

The switching gate electrode G2, the compensation gate electrode G3, the first initialization gate electrode G4, the first emission control gate electrode G5, the second emission control gate electrode G6, and the second initialization gate electrode G7 are defined by semiconductor layers that overlap the first to third scan lines 14, 24, and 34 and the emission control line 15. Also, the fourth electrode C4 is a portion of the second scan line 24. Therefore, a process of forming the switching gate electrode G2, the compensation gate electrode G3, the first initialization gate electrode G4, the first emission control gate electrode G5, the second emission control gate electrode G6, the second initialization gate electrode G7, and the fourth electrode C4 is thus a process of forming the first to third scan lines 14, 24, and 34 and the emission control line 15. The driving gate electrode G1 and the first electrode C1 are integrally formed. The first gate line GL1 material may include at least one metal selected from the group of Al, Pt, Pd, Ag, Mg, Au, Ni, Nd, Ir, Cr, Li, Ca, Mo, Ti, W, and Cu.

According to an embodiment, the first storage capacitor Cst1 overlaps the driving TFT T1. In particular, since the driving gate electrode G1 and the first electrode C1 are integrally formed in this embodiment, the first storage capacitor Cst1 has to overlap the driving TFT T1. However, when the entire size of the driving TFT T1, more particularly, a size of the driving gate electrode G1, is reduced in order to manufacture a high-resolution OLED display, the size of the first electrode C1 is also reduced, and thus, the storage capacity of the first storage capacitor Cst1 is reduced according to Equation 1 below. In Equation 1, "C" is the storage capacity of a storage capacitor, "ε" is the dielectric constant, "A" is the overlapping area of the two electrodes of the storage capacitor, and "d" is the distance between the overlapping electrodes.

$$C = \varepsilon \frac{A}{d} \qquad \text{[Equation 1]}$$

A substantially uniform storage capacity should to be maintained in a pixel so that gray scales are displayed by the OLED display without error. Therefore, a design for maintaining or supplementing the reduced storage capacity of the first storage capacitor Cst1 is necessary. According to an embodiment, the second storage capacitor Cst2 is separately formed from the first storage capacitor Cst1 so as to maintain or supplement the total storage capacity of the capacitors in each pixel.

The second gate insulating layer GI2 may be stacked on the entire surface of the substrate 100 to cover the first gate electrodes. The second gate insulating layer GI2 may be a single layer or layers formed of an inorganic material such as silicon oxide or silicon nitride. The second gate insulating layer GI2 insulates the first and second gate electrodes from each other. The "second gate electrode" will be described in detail below. Also, the second gate insulating layer GI2 functions as a dielectric layer of the first storage capacitor Cst1. In order to increase the storage capacity of the first storage capacitor Cst1 based on Equation 1, the second gate insulating layer GI2 is thinner than the first gate insulating layer GI1.

The second electrode C2 of the first storage capacitor Cst1 is formed on the second gate insulating layer GI2. The second electrode C2 overlaps the first electrode C1. However, the second electrode C2 includes the opening OP that exposes a portion of the first electrode C1. The opening OP may be the first contact hole 51. The first electrode C1 may be connected to the third electrode C3 via the first contact hole 51. The "second gate electrode" as used in this embodiment refers to the second electrode C2 that is formed of a second gate line GL2 material. Similar to the first gate line GL1 material, the second gate line GL2 material may also include at least one metal selected from the group of Al, Pt, Pd, Ag, Mg, Au, Ni, Nd, Ir, Cr, Li, Ca, Mo, Ti, W, and Cu.

The first interlayer insulating layer ILD1 is formed on the entire surface of the substrate 100 to cover the second electrode C2 of the first storage capacitor Cst1. The first interlayer insulating layer ILD1 may be formed of an organic insulating material, an inorganic insulating material, or have a multi-layer structure in which organic and inorganic insulating materials are alternately formed. For example, the inorganic insulating material may include a metal oxide or a metal nitride, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first interlayer insulating layer ILD1 insulates the second electrode C2 from the first electrode C1. Also, the first interlayer insulating layer ILD1, together with the second gate insulating layer GI2, functions as a dielectric layer of the second storage capacitor Cst2.

The third electrode C3 of the second storage capacitor Cst2 is formed on the first interlayer insulating layer ILD1. The third electrode C3 overlaps the fourth electrode C4 to form the second storage capacitor Cst2. Although not illustrated, the data line 16, the driving voltage line 26, and the first and second contact metals CM1 and CM2 are simultaneously formed with the third electrode C3. The third electrode C3 is connected to the first electrode C1 via the first contact hole 51 formed in the second gate insulating layer GI2 and the first interlayer insulating layer ILD1. The third electrode C3 is connected to the compensation TFT T3 and the first initialization TFT T4 via the second contact hole 52 formed in the first and second gate insulating layers GI1 and GI2, and the first interlayer insulating layer ILD1. "Data electrodes" as used in this embodiment refers to the third electrode C3, the data line 16, the driving voltage line 26, and the first and second contact metals CM1 and CM2 which are formed of a data line DAT material. The data line DAT material may include at least one metal selected from the group of Al, Pt, Pd, Ag, Mg, Au, Ni, Nd, Ir, Cr, Li, Ca, Mo, Ti, W, and Cu.

According to at least one embodiment, the second storage capacitor Cst2 does not overlap the first storage capacitor Cst1. Therefore, as shown in FIG. 6B, the first and second storage capacitors Cst1 and Cst2 may be separated. Accordingly, the storage capacity of each pixel may be substantially equal to the sum of storage capacities of the first and second storage capacitors Cst1 and Cst2.

A protection layer PL is formed on the entire surface of the substrate 100 to cover the third electrode C3. An anode electrode 111 is formed on the protection layer PL. The anode electrode 111 is connected to the second contact metal CM2 formed in the fifth contact hole 55 via the via hole VIA, and thus is connected to the second emission control drain electrode D6 and the second initialization source electrode S7.

Although not illustrated in FIG. 6A, the anode electrode 111 of the OLED is illustrated in FIG. 7 for the convenience of description. The OLED includes the anode electrode 111 and a cathode electrode facing the anode electrode 111. An intermediate layer that includes an organic emission layer is provided between the anode electrode 111 and the cathode electrode.

In FIGS. 6A and 7, from among the source and drain electrodes of the TFTs, source and drain electrodes that are not connected to other lines are formed on the same layer as corresponding semiconductor layers. That is, the source and drain electrodes of each of the TFTs may be selectively formed of polysilicon that is doped with a doping material. However, described technology is not limited thereto. A TFT according to another embodiment includes source and drain electrodes that are formed on a different layer from corresponding semiconductor layers and be connected to source and drain areas of the corresponding semiconductor layers via a contact hole.

As described above, according to at least one embodiment, a high-resolution OLED display maintains and supplements the capacitance of the pixels even when a plurality of pixels are formed in a limited space.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the inventive technology have been described with reference to the figures, it will be understood by those of ordinary skill in the art that various changes in form and details may be made therein without departing from the spirit and scope of the present invention as defined by the following claims.

What is claimed is:
1. An organic light-emitting diode (OLED) display, comprising:
  a plurality of pixels,
  wherein each of the pixels comprises:
    a driving thin film transistor (TFT) formed over a substrate and including a driving gate electrode;
    a first storage capacitor comprising a first electrode and a second electrode, wherein the first electrode is electrically connected to the driving gate electrode and wherein the second electrode is formed over the first electrode and electrically insulated from the first electrode; a second storage capacitor comprising a third electrode and a fourth electrode, wherein the second storage capacitor does not overlap the first storage capacitor, wherein the third electrode is electrically connected to the first electrode, and wherein the fourth electrode is: i) formed under the third electrode, ii) electrically insulated from the third electrode, and ii) formed on the same layer as the first electrode, wherein the third electrode of the second storage capacitor and the second electrode of the first storage capacitor are formed on and over different layers; and
    an interlayer insulating layer having bottom and top surfaces, wherein the bottom surface faces the TFT, wherein the bottom surface of the interlayer insulating layer covers the second electrode of the first storage capacitor, and wherein the third electrode of the second storage capacitor is formed on the top surface of the interlayer insulating layer.

2. The OLED display of claim 1, wherein each of the driving gate electrodes is integrally formed with the corresponding first electrode.

3. The OLED display of claim 1, wherein each of the driving TFTs further comprises a driving semiconductor layer formed under the driving gate electrode, and wherein each of the driving semiconductor layers is electrically insulated from the corresponding driving gate electrode via a first gate insulating layer.

4. The OLED display of claim 3, wherein each of the pixels further comprises an OLED and an emission control TFT formed between the driving TFT and the OLED and wherein each of the emission control TFTs comprises:

an emission control semiconductor layer formed on the same layer as the driving semiconductor layer; and an emission control gate electrode electrically insulated from the emission control semiconductor layer via the first gate insulating layer, wherein the emission control gate electrode is formed on the same layer as the driving gate electrode.

5. The OLED display of claim 4, further comprising a second gate insulating layer formed between the first and second electrodes.

6. The OLED display of claim 5, wherein the interlayer insulating layer is formed between the third and fourth electrodes.

7. The OLED display of claim 4, wherein each of the second electrodes is electrically connected to a corresponding driving voltage line configured to transmit a driving voltage for driving the corresponding OLED.

8. The OLED display of claim 4, further comprising a protection layer formed over the third electrode, wherein each of the OLEDs comprises:

an anode electrode formed over the protection layer;
a cathode electrode facing the anode electrode; and
an intermediate layer interposed between the anode and cathode electrodes.

9. The OLED display of claim 1, wherein each pixel further comprises an initialization TFT formed between the driving TFT and an initialization voltage line configured to transmit an initialization voltage, wherein each of the initialization TFTs is configured to be turned on by a corresponding scan signal so as to transmit the initialization voltage to the corresponding driving gate electrode.

10. The OLED display of claim 9, wherein the fourth electrode is electrically connected to a scan line configured to transmit the scan signal.

* * * * *